United States Patent
Jung et al.

(10) Patent No.: US 6,542,426 B2
(45) Date of Patent: Apr. 1, 2003

(54) CELL DATA PROTECTION CIRCUIT IN SEMICONDUCTOR MEMORY DEVICE AND METHOD OF DRIVING REFRESH MODE

(75) Inventors: Tae Hyung Jung, Seoul (KR); Jong Hoon Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/032,079

(22) Filed: Dec. 31, 2001

(65) Prior Publication Data

US 2002/0176302 A1 Nov. 28, 2002

(30) Foreign Application Priority Data

May 25, 2001 (KR) .................................... 2001-29103

(51) Int. Cl.$^7$ ................................................ G11C 7/00
(52) U.S. Cl. ........................ 365/222; 365/194; 365/203
(58) Field of Search ................... 365/222, 194, 365/203

(56) References Cited

U.S. PATENT DOCUMENTS

| | | | |
|---|---|---|---|
| 5,761,151 A | * 6/1998 | Hatakeyama | ................ 365/194 |
| 5,870,348 A | 2/1999 | Tomishima et al. | .... 365/230.06 |
| 5,920,885 A | 7/1999 | Rao | ............................ 365/203 |
| 5,999,471 A | 12/1999 | Choi | ............................ 365/222 |
| 6,028,812 A | 2/2000 | Tanaka | ................... 365/230.03 |
| 6,084,818 A | 7/2000 | Ooishi | ................... 365/230.03 |
| 6,097,663 A | 8/2000 | Watanabe et al. | ....... 365/230.03 |
| 6,108,254 A | 8/2000 | Watanabe et al. | ............ 365/203 |
| 6,115,319 A | 9/2000 | Kinoshita et al. | ....... 365/230.03 |
| 6,128,248 A | * 10/2000 | Idei et al. | .................... 365/194 |
| 6,172,928 B1 | 1/2001 | Ooishi | ......................... 365/222 |
| 6,175,532 B1 | 1/2001 | Ooishi | ................... 365/230.03 |

FOREIGN PATENT DOCUMENTS

| | | |
|---|---|---|
| JP | 05-083290 | 4/1993 |
| JP | 09-162886 | 6/1997 |
| JP | 10-075252 | 3/1998 |

* cited by examiner

*Primary Examiner*—Trong Phan
(74) *Attorney, Agent, or Firm*—Pillsbury Winthrop LLP

(57) ABSTRACT

Disclosed is a cell data protection circuit in a semiconductor memory device and a method of driving a refresh mode in the same. The method includes the steps of disabling a word line in a refresh mode faster than in a normal mode, and initiating a bit line equalizing using a same way of the normal mode, wherein the bit line equalizing is initiated after the word line is completely closed so as to prevent an influence of the bit line equalizing on cell data. The circuit includes a first delay element producing word line disabling and bit line equalizing signals, a second delay part, a third delay part, and a selection part outputting the signals generated from the first delay element on a refresh operation, the selection part outputting the signals generated from the second delay element in a normal operation, wherein the word line disabling signal and bit line equalizing signal are produced so as to satisfy a RAS precharge time (tRP) and a RAS read time (tRWL) after a write command in the normal operation and wherein the word line disabling signal and bit line equalizing signal are produced so as to leave a time interval between the word line disabling signal and bit line equalizing signal.

9 Claims, 10 Drawing Sheets

CELL DATA PROTECTION CIRCUIT IN SEMICONDUCTOR MEMORY DEVICE AND METHOD OF DRIVING REFRESH MODE

BACKGROUND

1. Field of Invention

The inventions described in this patent document relate in general to cell data protection for a semiconductor memory device and methods of driving a dynamic random access memory (DRAM) during refresh mode to protect cell data during a refresh mode operation.

2. General Background and Related Art

A general construction of a DRAM is explained with reference to FIG. 1 (Prior Art) to provide appropriate background and context for the description of the claimed inventions. A DRAM includes a memory cell array part 10 storing a plurality of data, a row address buffer part 11 receiving an m bit row address A0~Am−1, a column address buffer part 12 receiving an n bit column address A0~An−1, a row decoder part 13 selecting a word line(s) (not shown in the drawing) of the memory cell array part 10 by a signal outputted from the row address buffer part 11, a column decoder part 14 selecting a bit line(s) (not shown in the drawing) of the memory cell array part 10 by a signal outputted from the column address buffer part 12, a data input buffer part 15 receiving data, and an output buffer part 16 outputting data $DQ0$~$DQ^{K}-1$. The DRAM further includes a sense amplifier part 17 connected to the bit line(s) in the memory cell array and amplifying a data signal(s) read from the selected cell(s), an I/O gate circuit part 18 responding to an output(s) of the column decoder part 14 and connecting the bit line(s) in the memory cell array selectively to the data input and output buffer parts 15 and 16, and a chip control part 20 controlling operations of peripheral circuits of the memory cell array part 10.

As is well known, each of the memory cells in DRAM includes a selection transistor and a data storage capacitor. Thus, DRAM is widely used as a semiconductor memory device proper for increasing the integration density on a semiconductor substrate.

Yet, electric charges leak through the storage capacitor and selection transistor in DRAM. Thus, it is necessary to refresh by recharging the DRAM memory cells with electric charges periodically. Compared to SRAM or non-volatile semiconductor memory, DRAM, as shown in FIG. 1 (Prior Art), further includes a refresh circuit part 30 enabling data signals stored in the memory cells to be amplified by the sense amplifier part 17 periodically so as to be re-written in the memory cells. The refresh circuit part 30 is constructed with a refresh timer part 31 producing timing a signal(s) for carrying out a periodic refresh operation, a refresh control part controlling overall operations relating to the refresh in a memory device in accordance with the timing signal(s), and a refresh address producing part 33 producing internal refresh addresses by being controlled by the refresh control part 32.

There are well-known methods for refreshing DRAM cells. Common refresh methods are explained in brief as follows.

First, RAS Only Refresh (ROR) is a method of refreshing cells by activating a row address strobe bar (/RAS) only while a column address strobe bar (/CAS) signal maintains a precharge level. In ROR, a memory device should be provided with refresh addresses from outside for the respective refresh operations. Address buses connected to the memory device fail to be used for other purposes during the respective refresh operations.

Second, there is CAS-Before-RAS (CBR) refresh. Such a CBR refresh is carried out by producing row addresses in the refresh timer part 31 built in a DRAM chip instead of giving refresh addresses from outside.

Third, there is Hidden Refresh as another refresh method. In Hidden Refresh, a read operation is combined with a CBR operation. During a read cycle, when /CAS becomes active as 'low', output data maintains still valid. In this case, if /RAS becomes 'high' and then returns to 'low', a CBR state begins. Thus, one cycle of the CBR refresh is completed. As data output part 16 is controlled by /CAS only, it seems externally that valid data are outputted during this cycle all the time so as to be a normal read operation. Yet, the refresh is internally performed using internal addresses produced by a CBR counter. Therefore, it is called Hidden Refresh.

In the above-explained ROR, CBR refresh, and Hidden Refresh, the /RAS signal is applied thereto from outside and refresh addresses are received from outside or produced internally, which is so-called a pulse refresh method. Lately, the /RAS signal used as a refresh synchronizing signal is also used for the purposes such as low power consumption on an operation mode produced inside DRAM, battery back-up (BBU) and the like. Namely, only if DRAM control signals satisfy a specific timing condition (in this case, at least 100 elapses by maintaining this mode after CBR is entered) (i.e. if a self-refresh pulse width tRASS is at least 100, a refresh demanding signal is produced automatically by the refresh timer part 31 without the external control signal so that the RAS series control signals are produced automatically inside the device and the refresh operation is executed by the address generated inside. Such a refresh operation is called Self-Refresh.

The self-refresh mode is used for a low power consumption operation or a long-term data storage. In the self-refresh mode, entire input pins including clocks except a clock enabling cke pin become inactive and a refresh enter command and the refresh addresses are generated to extend their periods, thereby enabling to reduce the power consumption.

The self-refresh mode, when the entire banks are at an idle state, is entered by making a chip selection signal /CS, a RAS bar signal /RAS, a CAS bar signal /CAS, and a clock enabling signal CKE become 'low' and a write enabling signal /WE become 'high. Once this mode is entered, all the input pins except the clock enabling cke signal are ignored.

A method of escaping from the self-refresh mode includes the following steps. First, a clock buffer is normalized by inputting a clock normally thereto and making the clock enabling signal cke become 'high' . After a predetermined time (/RAS precharge time) tRP elapses, SDRAM becomes at an idle state. It is then able to input another command thereto at this state.

A time interval required for refreshing all the rows on a cell array, i.e. a time length from a refresh operation of a certain row in a memory cell array to another refresh operation of the next row, is generally called a refresh period. For instance, in 16 MB DRAM carrying out 2K(2048) refresh cycles per a period and constructed with 2048 rows×512 columns×16 bits, when a maximum time interval, i.e. a refresh cycle, required for refreshing 512 memory cells connected in a row is 128 ms, it is necessary to refresh 2048 rows in order within the time interval. In such a case, an inter-cycle time interval, i.e. a refresh clock period, becomes about 62.5 (=128÷2048 rows) and one refresh cycle, ex. 80 to 200 ns, is executed per given time interval of 62.5.

FIG. 2 (Prior Art) is a timing diagram explaining a read-modify-write (RMW) operation in a general DRAM. The same data having been read from a selected memory cell are written in the same memory cell which is meaning less. Hence, the data having been read are written reversibly (i.e. modified) in the memory cell in the read-modify-write (RMW) operation, 'tRWC' is a read-modify-write cycle time during which '/RAS' becomes active as 'low'. And, 'tRP' is a /RAS precharge time for an interval during which '/RAS' having become active as 'low' is precharged as 'high'. 'tRWD is a time interval from a time point at which a '/RAS' becomes active low to another time point at which '/WE' becomes active as 'low'. 'tRWL' is an time interval from a time point at which a write enabling bar signal /WE becomes active as 'low' to another time-point at which '/RAS' becomes active as 'low'. 'tCWL' is an time interval from a time point at which the write enabling bar signal /WE becomes active as 'low' to another time point at which '/CAS' becomes active as 'low'. 'tRCS' is a read command setup time. 'tCWD' is a time interval from a time point at which /CAS becomes as 'low' to another time point at which '/WE' becomes active as 'low'. 'tWP' is a write command pulse width. 'tCAC' is a time interval from a time point at which '/CAS' becomes active as 'low' to another time point at which data are outputted. 'tDS' is a data setup time. 'tDH' is a data hold time. 'tRAC' is a time interval from a time point at which 'RAS' becomes active as 'low' to another time point at which data are outputted. And, 'tMOD' is a time interval from a time point at which data are outputted to another time point at which a write command signal is input.

FIG. 3 (Prior Art) is a block diagram of a precharge control signal producing circuit producing a word line disabling signal WLDE, bit line sense amplifier control signals SN, /SN, /SP1, and /SP2, and a bit line equalizing signal BLEQ on a precharge operation according to a related art. A precharge control signal producing circuit is constructed with a first delay element 40 producing a word line disabling signal WLDE and a bit line sense amplifier disabling signal SADE after a first delay time by receiving a precharge signal informing a precharge operation and a second delay element 42 producing an address reset signal ADD_RESET and a bit line equalizing signal BLEQ after a second delay time elapses from a time at which the signal outputted from the first delay element 40 is received.

The first delay element 40 produces the word line disabling signal WLDE and bit line sense amplifier disabling signal SADE after 8 to 9 ns elapses from the time at which the precharge signal PRECH is received. The second delay element 42 produces the address reset signal ADD_RESET and bit line equalizing signal BLEQ after 12 to 13 ns elapses from the time at which the precharge signal PRECH is received.

When the bit line sense amplifier disabling signal SADE becomes active, bit line sense amplifier enabling signals /SN and SN and a second driving signal /SP2 shown in FIG. 4 (Prior Art) are disabled respectively to control an operation of a bit line sense amplifier.

FIG. 4 (Prior Art) illustrates a bit line sense amplifier in a general DRAM. A bit line sense amplifier as a cross-coupled latch type, which is constructed between a pull-up bias node Nd1 and a pull-down bias node Nd2, includes a sense amplifier part 50 detecting and amplifying data of a bit line BL and a bit bar line /BL, a first pull-up driver part 52 connected in series between an external power source voltage Vdd supplied thereto externally and the pull-up bias node Nd1 and comprising PMOS transistors P3 and P5 supplying the pull-up bias node Nd1 with the external power source voltage Vdd on an initial operation of the sense amplifier part 50 by being controlled by the first driving signal /SP1 and the sense amplifier enabling signal /SN respectively, a second pull-up driver part 54 connected between an internal power source voltage Vdc and the pull-up bias node Nd1 and comprising a PMOS transistor P4 supplying the pull-up bias node Nd1 with the internal power source voltage Vdc by being controlled by the second driving signal /Sp2 after the first driving signal /SP1 is disabled, and a pull-down driver part 56 connected between the pull-down bias node Nd2 and a ground voltage Vss and comprising an NMOS transistor N3 controlled by the sense amplifier enabling signal SN.

DRAM uses a latch type bit line sense amplifier BLSA in order to amplify micro-charges co-owned by a cell capacitor and a bit line BL (or a bit bar line /BL) to the extents of a level (1.8V) of the power source voltage Vdc enabling to be recognized as 'high' data and another level (0V) of the ground voltage Vss enabling to be recognized as 'low' data. Yet, it is time-consuming that data stored in a cell and its complement data are sensed to be developed into the levels of the power source voltage Vdc and ground voltage levels Vss. Thus, the bit line sense amplifier BLSA takes an overdriving operation on an initial operation. Such an operation overdrives a signal to be amplified to 'high' data by supplying the pull-up bias node Nd1 of the sense amplifier with the external and internal power source voltages Vdd and Vdc in order by the first and second driving signals /SP1 and /SP2. Namely, the initial operation of the bit line sense amplifier BLSA is driven fast by the external power source voltage VDD applied thereto by the first driving signal SP1 and then maintains its operational state by the internal power source voltage Vdc applied thereto by the second driving signal SP2.

FIG. 5A and FIG. 5B are timing diagrams explaining normal and refresh operations in a DRAM according to a related art.

A process of outputting data stored in a semiconductor memory cell is explained by referring to FIG. 4, FIG. 5A and FIG. 5B as follows.

First, when the word line driving signal WL for activating one word line using a received row address becomes active from 'low' to 'high', the sense amplifier enabling signal SN becomes active as 'high' [the sense amplifier enabling signal /SN (not shown in the drawing) becomes active as 'low'] after a predetermined time elapses and the first driving signal /SP1 becomes active as 'low' for a predetermined time. Thus, the bit line sense amplifier BLSA operates so as to latch the cell data on the activated word line. In this case, the bit line sense amplifier BLSA performs the overdriving operation by the external power source voltage Vdd provided by the first driving signal /SP1 and then is operated by the internal power source voltage Vdc by the second driving signal /SP2.

Then, when a column address is inputted, information of the selected bit line sense amplifier is transferred to a data line sense amplifier (not shown in the drawing) through a data bus line. The data amplified by the data line sense amplifier are outputted externally through a data output buffer.

Meanwhile, when the word line driving signal is disabled from 'high' to 'low', the sense amplifier enabling signals SN and /SN are disabled and the second driving signal /SP2 of the sense amplifier is disabled from 'low' to 'high'. Thus, the bit line sense amplifier BLSA stops its operation. Moreover, when the word line driving signal WL is disabled into 'low', the bit line equalizing signal BLEQ becomes active from 'low' to 'high' so as to precharge the bit line BL and the bit bar line /BL with half power source voltages ½ Vdd respectively.

In this case, the bit line equalizing signal BLEQ is produced after the word line and bit line sense amplifier have been disabled.

However, in a semiconductor memory device using a refresh operation according to a related art, a signal is produced without temporal margin between an interval where the word line WL is disabled and the other interval where the bit line equalizing signal BLEQ is generated on the last precharge operation so as to satisfy 'tRP' (/RAS precharge time)and 'tRWL' (write command to /RAS read time) on a refresh operation. Namely, the word line should be maintained at least 10 ns to hold a time sufficiently for storing the written data in a cell, while the operation time point of a bit line equalizing operation is no longer extended to satisfy tRP=15.

The semiconductor memory device according to the related art, as shown in FIG. 5B, the interval where the word line WL is disabled is overlapped with the other interval where the bit line equalizing signal BLEQ is enabled, thereby causing a damage on data stored in a cell.

SUMMARY

Among the various inventions described and/or claimed, there is disclosed a cell data protection circuit for a semiconductor memory device and a method of driving a refresh mode in the same that substantially obviate one or more of the problems due to limitations and disadvantages of the related art.

Among the inventions, there is provided a cell data protection circuit in a semiconductor memory device and a method of driving a refresh mode in the same which enable to protect cell data on a refresh operation by disabling a word line completely on a refresh operation of DRAM and then executing a bit line equalizing operation.

Various features and advantages of the inventions described and claimed herein will be set forth in the detailed description which follows, taken in conjunction with the drawings, also constituting disclosure of the claimed inventions.

In part, the inventions provide a method of driving a refresh mode in a semiconductor memory device which includes: disabling a word line in a refresh mode faster than in a normal mode, and initiating a bit line equalizing in a same way of the normal mode, wherein the bit line equalizing is initiated after the word line is completely closed so as to prevent an influence of the bit line equalizing on cell data.

There is also described a method of driving a refresh mode in a semiconductor memory device which includes: disabling a word line in a refresh mode in a same way of a normal mode, and initiating a bit line equalizing slower than the normal mode, wherein the bit line equalizing is initiated after the word line is completely closed so as to prevent an influence of the bit line equalizing on cell data.

There is also described a cell data protection circuit in a semiconductor memory device includes a first delay part producing a word line disabling signal having a first delay time and a bit line sense amplifier disabling signal having the first delay time by receiving a precharge signal, a second delay element producing the word line disabling signal and bit line sense amplifier disabling signal having a second delay time by receiving the signals from the first delay part, a third delay element producing an address reset signal having a third delay time and a bit line equalizing signal having the third delay time by receiving the signals outputted from the second delay part, and a selection part outputting the signals generated from the first delay element on a refresh operation, the selection part outputting the signals generated from the second delay element in a normal operation, wherein the word line disabling signal and bit line equalizing signal are produced so as to satisfy a RAS precharge time (tRP) and a RAS read time (tRWL) after a write command in the normal operation and wherein the word line disabling signal and bit line equalizing signal are produced so as to leave a time interval between the word line disabling signal and bit line equalizing signal.

Accordinly, a data protection circuit in a semiconductor memory device according to the present invention, as is the same of the related art, enables to satisfy both 'tRP' and 'tRWL' by producing the bit line equalizing signal BLEQ right after the word line disabling signal WLDE is generated on a normal operation.

Moreover, the present invention, which needs no margin such as 'tRWL' on a refresh operation, enables to protect data carried by the bit line by producing the word line disabling signal WLDE in a short time and then by producing the bit line equalizing signal BLEQ after a predetermined time elapses.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Figure 1:
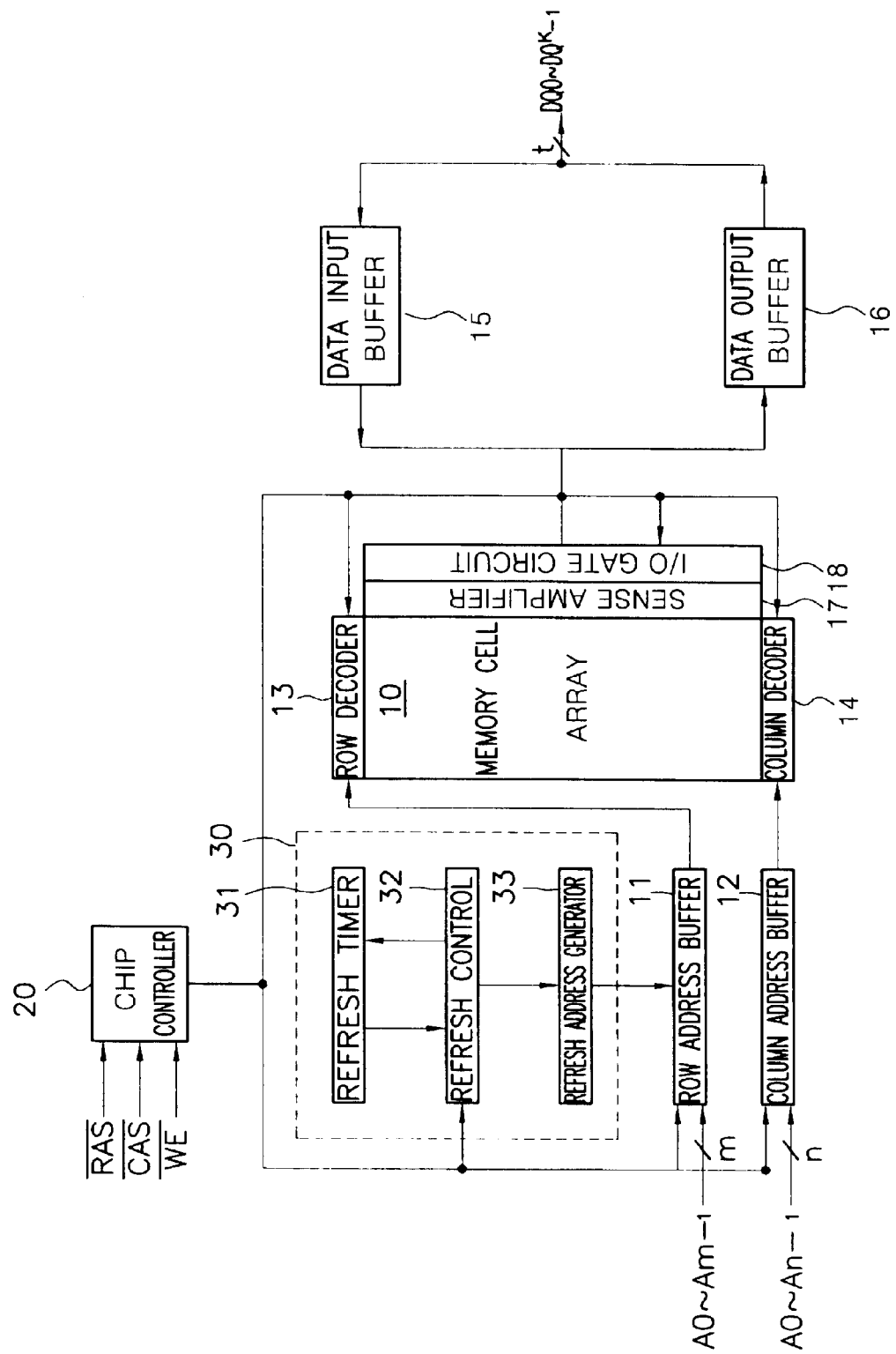
FIG. 1 (Prior Art) is a general block diagram of a DRAM.
Figure 2:
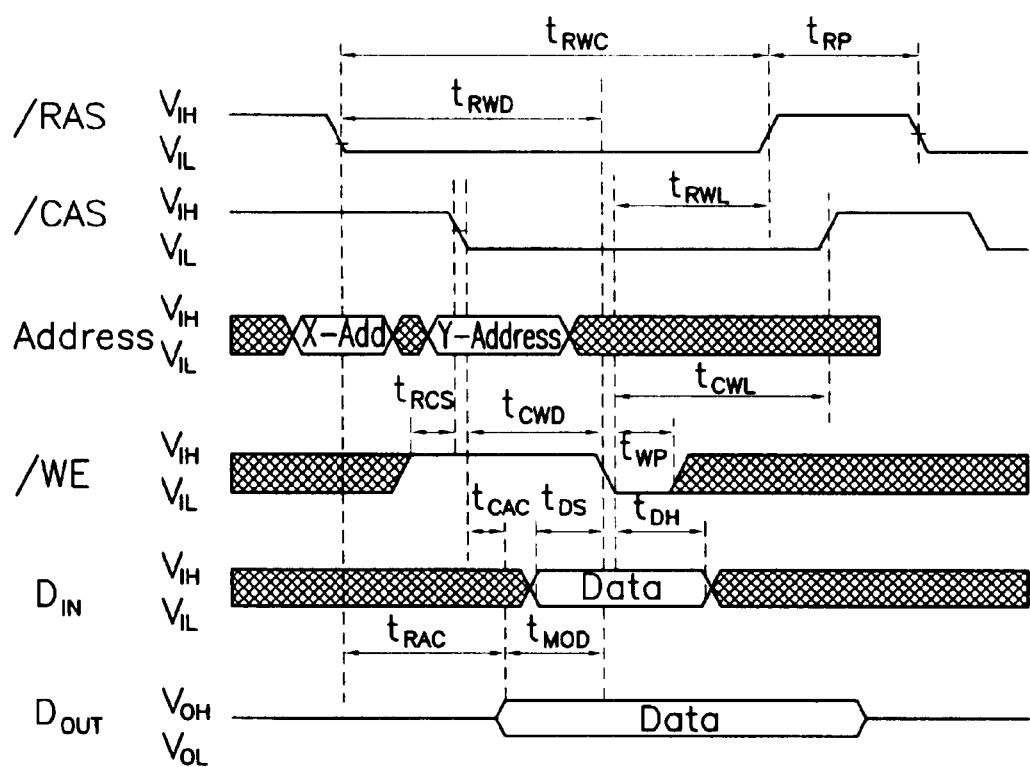
FIG. 2 (Prior Art) is a timing diagram explaining a read modify write operation in the DRAM shown in FIG. 1 (Prior Art)
Figure 3:
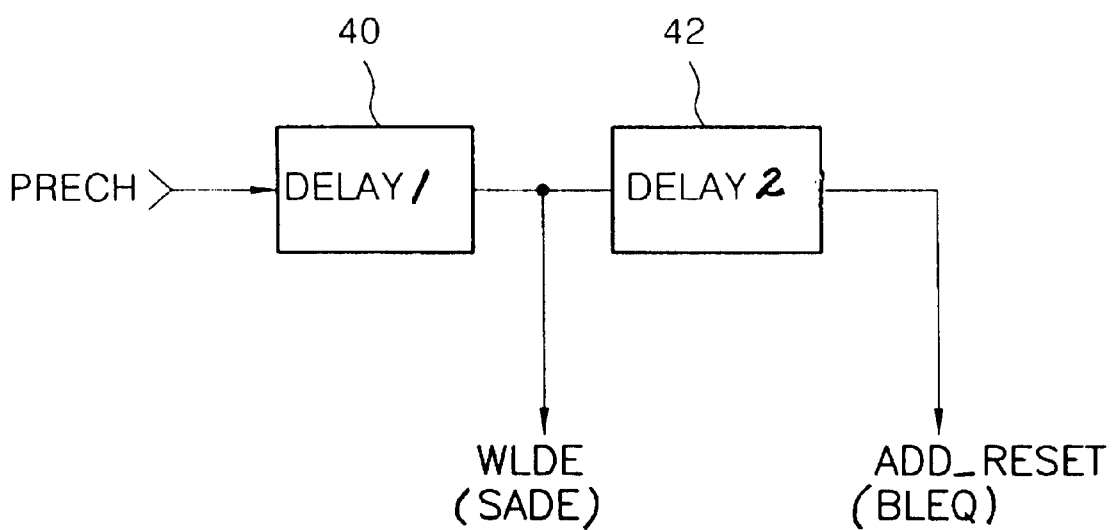
FIG. 3 (Prior Art) shows a precharge control signal producing circuit producing various control signals on a precharge operation according to a related art.

Reference will now be made in detail to the preferred embodiments of the present invention, examples of which are illustrated in the accompanying drawings. Where possible, the same reference numerals will be used to illustrate like elements throughout the specification.

Figure 6A:
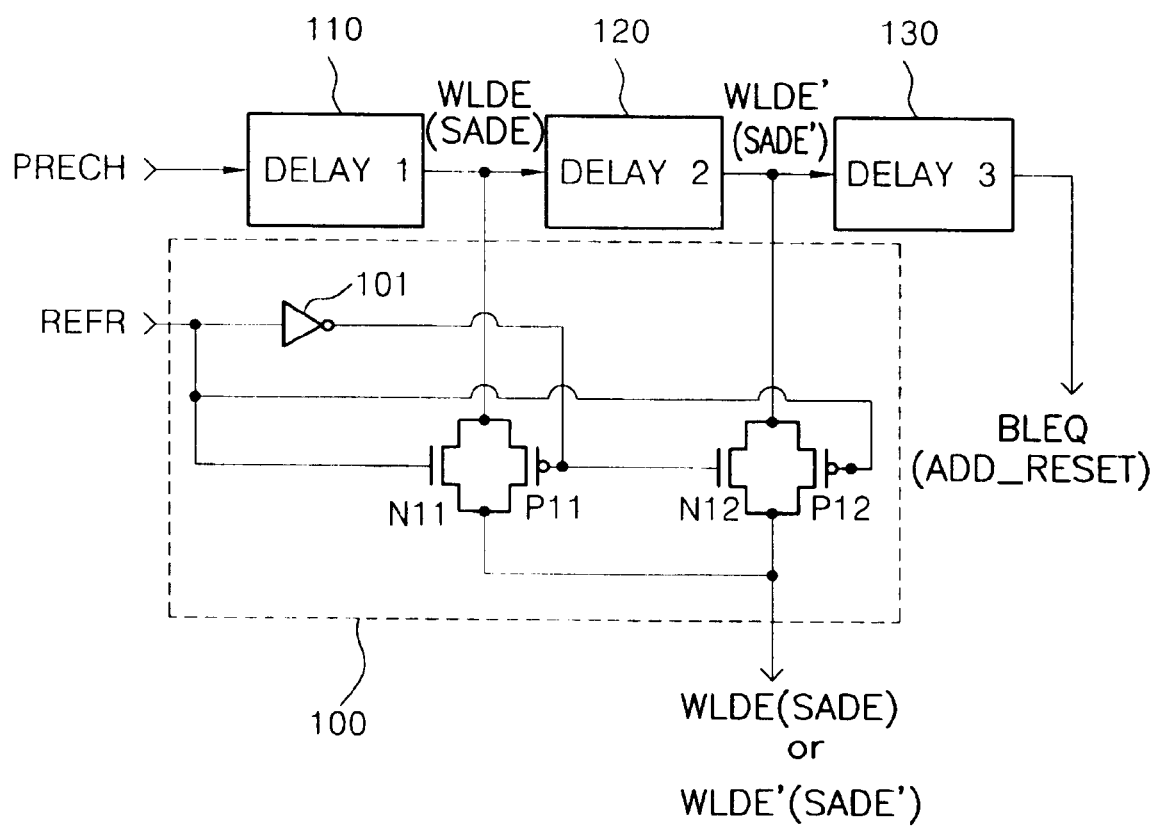
FIG. 6A illustrates a cell data protection circuit in a semiconductor memory device according to an embodiment of the inventions described herein.

FIG. 6A illustrates a cell data protection circuit in a semiconductor memory device according to an embodiment of the inventions described herein. A cell data protection circuit in a semiconductor memory device according to the present invention is constructed with a first delay element 110 producing a word line disabling signal WLDE and a bit line sense amplifier disabling signal SADE after a first delay time by receiving a precharge signal PRECH, a second delay element 120 producing a word line disabling signal WLDE' and a bit line sense amplifier disabling signal SADE' after a second delay time elapses, a third delay element 130 producing an address reset signal ADD_RESET and a bit line equalizing signal BLEQ after a third delay time elapses by receiving a signal outputted from the second delay element 120, and a selection part 100 selecting either the signal WLDE (SADE) outputted from the first delay element 110 or the other signal WLDE' (SADE') outputted from the second delay element 120 so as to output the selected signal WLDE (SADE) or WLDE' (SADE+).

The first delay element 110 produces the signal WLDE (SADE) after 4 to 9 ns (8 to 9 ns in the related art) elapses from the time at which the precharge signal PRECH is received. The second delay element 120 produces the signal WLDE' (SADE') which is received from the first delay element 110 and delayed for 3 to 5 ns. Namely, the signal WLDE (SADE) is produced after 8 to 9 ns elapses from the time at which the precharge signal PRECH is received. And, the third delay element 130 produces the signal ADD_RESET (BLEQ) after 3 to 5 ns elapses from the time at which the signal WLDE' (SADE') is received from the second delay element 120. Namely, the signal ADD_RESET(BLEQ) is produced after 12 to 12 ns elapses from the time at which the precharge signal PRECH is received. Such limitations are established on the assumption that a RAS precharge time tRP is 15 ns.

Figure 4:
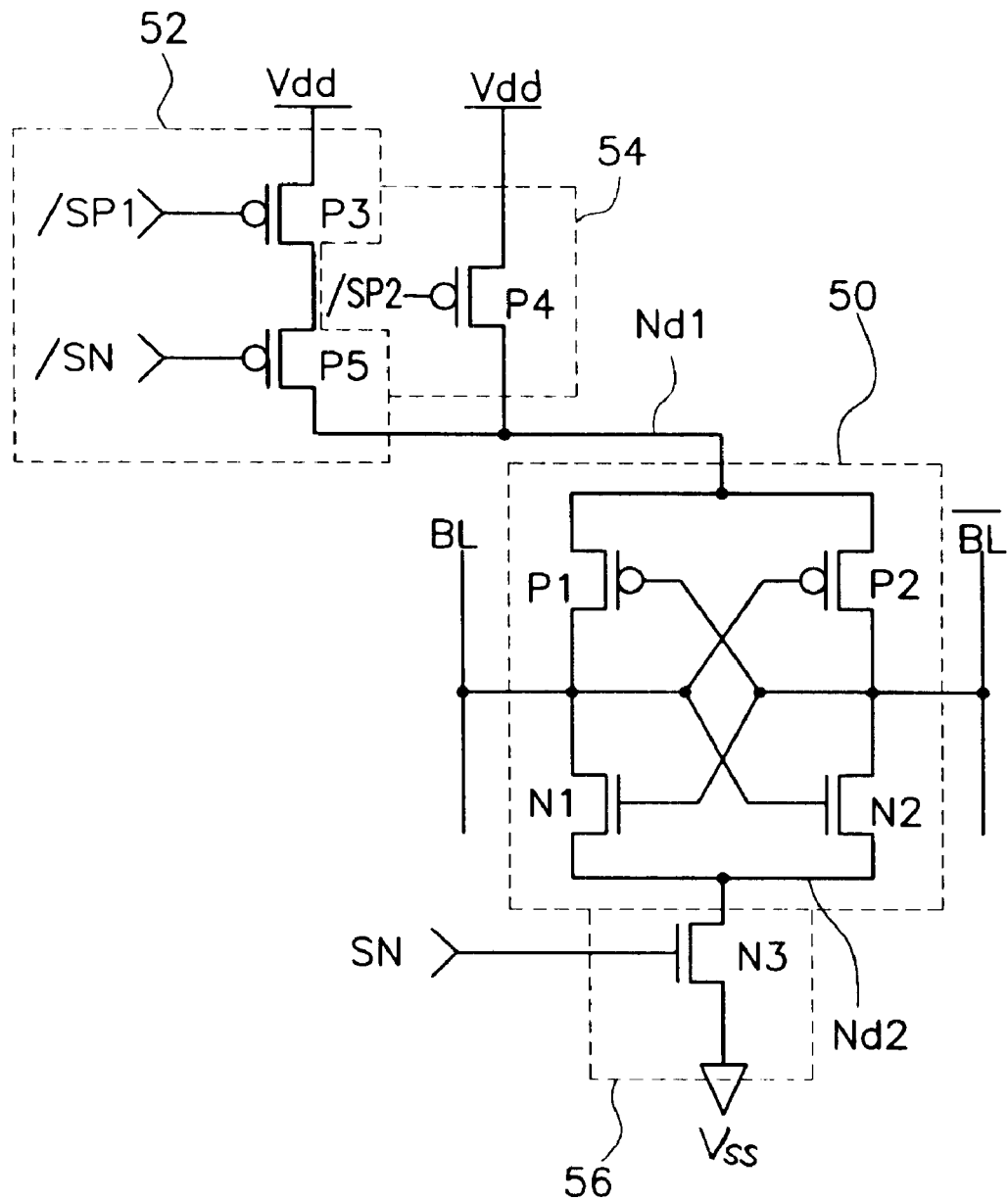
FIG. 4 (Prior Art) is a circuit diagram showing a bit line sense amplifier in a common DRAM.

When the bit line sense amplifier disabling signal SADE becomes active, the enabling signals /SN and SN of the bit line sense amplifier and the second driving signal /SP2, as shown in FIG. 4, are disabled respectively so as to stop operating the bit line sense amplifier.

The selection part 100 is constructed with first transfer gates P11 and N11 outputting the word line disabling signal WLDE and bit line sense amplifier disabling signal SADE received from the first delay element 110 and second transfer gates P12 and N12 outputting the word line disabling signal WLDE' and bit line sense amplifier disabling signal SADE' received from the second delay element 120 when the refresh operation signal REFR is disabled as 'low' (normal operation mode). In this case, the first transfer gates P11 and N11 and the second transfer gates P12 and N12 are constructed with combinations of PMOS and NMOS transistors respectively.

The selection part 100 outputs the word line disabling signal WLDE' and bit line sense amplifier disabling signal SADE' received by the second delay element 120 through the second transfer gates P12 and N12 on a normal operation {a state that the refresh operation signal REFR is disables as 'low'}. In this case, the word line disabling signal WLDE' and bit line sense amplifier disabling signal SADE' outputted from the selection part 100 are signals delayed to the extent of 8 to 9 ns from the time point at which the precharge signal PRECH is received. Then, the bit line equalizing signal BLEQ is produced through the third delay element 130 after 1 to 2 ns elapses from the time point at which the word line disabling signal WLDE'. has been produced.

Therefore, the cell data protection circuit in a semiconductor memory device according to the present invention, when the RAS precharge time tRP is 15 ns on the normal operation, produces the word line disabling signal WLDE and bit line sense amplifier signal BLEQ in the 'tRP', thereby satisfying both 'tRP and 'tRWL (write command to /RAS read time).

Selection part 100 outputs the word line disabling signal WLDE and bit line sense amplifier disabling signal SADE received by the first delay element 110 through the first transfer gates P11 and N11 on a refresh operation {a state that the refresh operation signal REFR becomes active as 'high'}. In this case, the word line disabling signal WLDE and bit line sense amplifier disabling signal SADE outputted from the selection part 100 are signals delayed 4 to 5 ns form the time point at which the precharge signal PRECH is received. After the word line disabling signal WLDE has been produced, the bit line equalizing signal BLEQ is produced through the third delay element 130 after 7 to 8 ns elapses in the second and third delay parts 120 and 130 respectively.

The word line disabling signal WLDE is produced after 4 to 5 ns elapses form the time point at which the precharge signal PRECH is received, while the bit line equalizing signal BLEQ is produced after 12 to 13 ns elapses form the time point at which the precharge signal PRECH is received. There exists a sufficient temporal margin between operations of disabling the word line and equalizing the bit line (such a signal generation is possible as the refresh operation needs no margin such as 'tRWL'). The bit line-equalizing signal BLEQ is produced after the word line has been completely disables, thereby enabling to protect data stored in a cell.

Figure 7A:
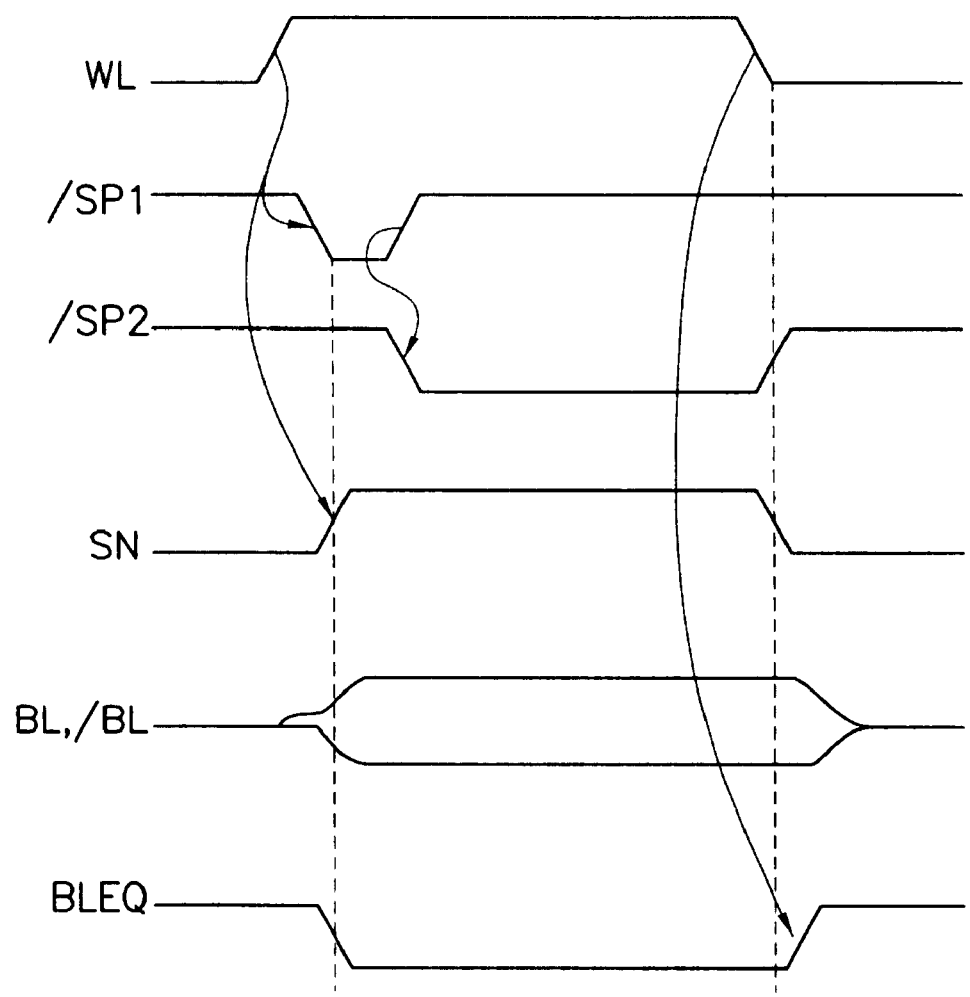
FIG. 7A is a timing diagram explaining a refresh operation by the cell data protection circuit shown in FIG. 6A.
Figure 7B:
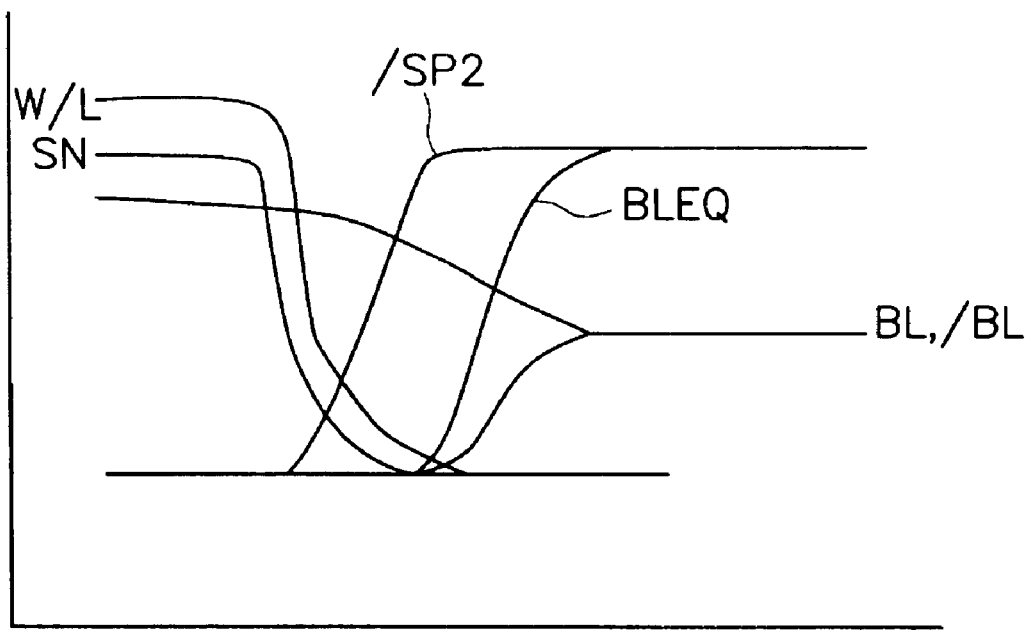
FIG. 7B is a timing diagram of a magnified disabling interval of a word line and an enabling interval of a bit line-equalizing signal in FIG. 7A.

FIG. 7A illustrates an operation timing graph of a refresh operation by the cell data protection circuit shown in FIG. 6A, and FIG. 7B illustrates an operation timing graph of a magnified disabling interval of a word line and an enabling interval of a bit line equalizing signal in FIG. 7A.

Figure 5A:
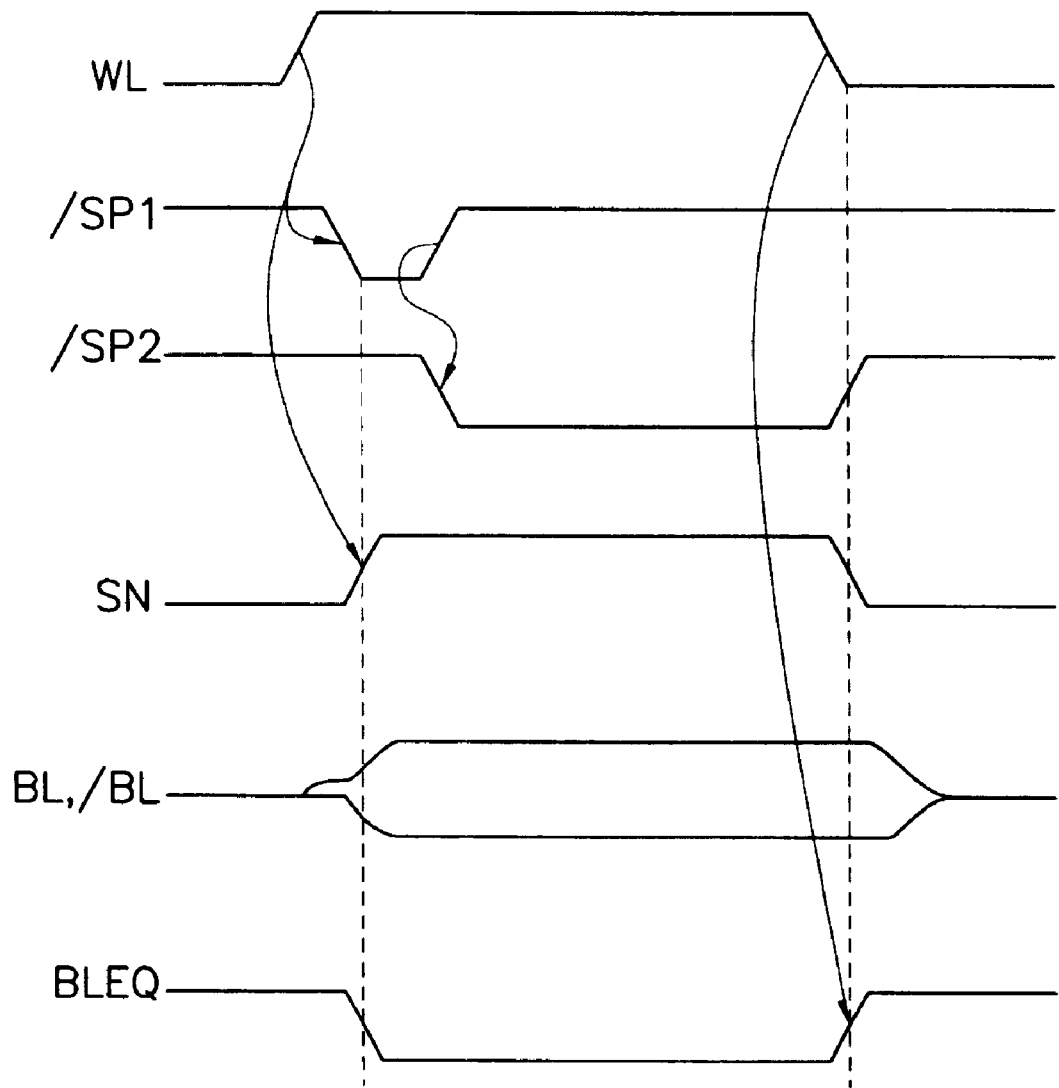
FIG. 5A (Prior Art) and FIG. 5B (Prior Art) are timing diagrams illustrating normal and refresh operations of a DRAM according to a related art.
Figure 5B:
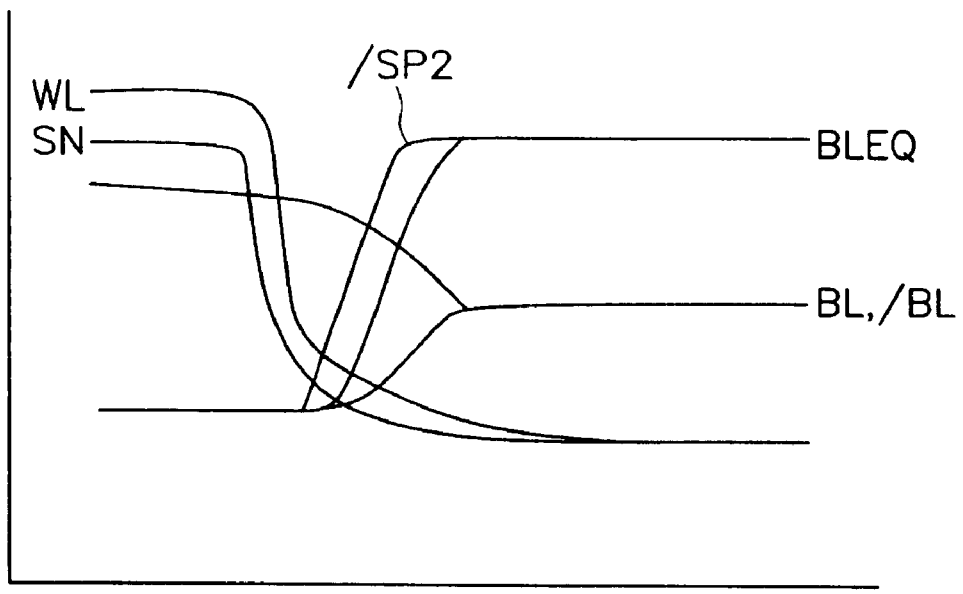

During an interval between which the word line driving signal WL becomes enabled as 'high, operation waveforms of the control signals /SP1, /SP2, and SN in the sense amplifier sensing data of a bit line BL and a bit bar line /BL and another waveform of the bit line equalizing signal BLEQ are identical to those of the related art explained in FIG. 5A.

Meanwhile, when the word line driving signal WL becomes disables from 'high' to 'low', the sense amplifier enabling signals SN and /SN (not shown in the drawing) are disabled respectively and the second driving signal /SP2 of the sense amplifier becomes disabled from 'low' to 'high'. Thus, the bit line sense amplifier stops operating. Moreover, after a predetermined time elapses from the time at which the word line driving signal WL is disabled as 'low' completely, the bit line equalizing signal BLEQ becomes active as 'high' so as to precharge the bit line BL and the bit bar line /BL with half power source voltage ½ Vdd. Therefore, on a refresh mode, the word line is disabled in a short time as long as 4 to 7 ns. After a predetermined time elapses from the time at which the word line is disabled, the bit line equalizing signal BLEQ is produced so as to protect data on the bit line.

Consequently, on the assumption that the RAS precharge time tRP is 15 ns, the word line disabling signal WLDE is produced before 11 ns elapses form the time at which the precharge signal PRECH is generated in order to satisfy the RAS precharge time tRP and 'tRWL (write command to /RAS read time)' when DRAM operates normally (which is the same as the related art). Yet, as the refresh operation needs no margin such as 'tRWL', the word line disabling signal WLDE is produced after 4 to 5 ns elapses from the time point at which the precharge signal PRECH is generated. In this case, the bit line equalizing signal BLEQ is produced after 7 to 8 ns elapses from the time point at which the precharge signal PRECH is generated, thereby enabling to protect data carried by the bit line.

Figure 6B:
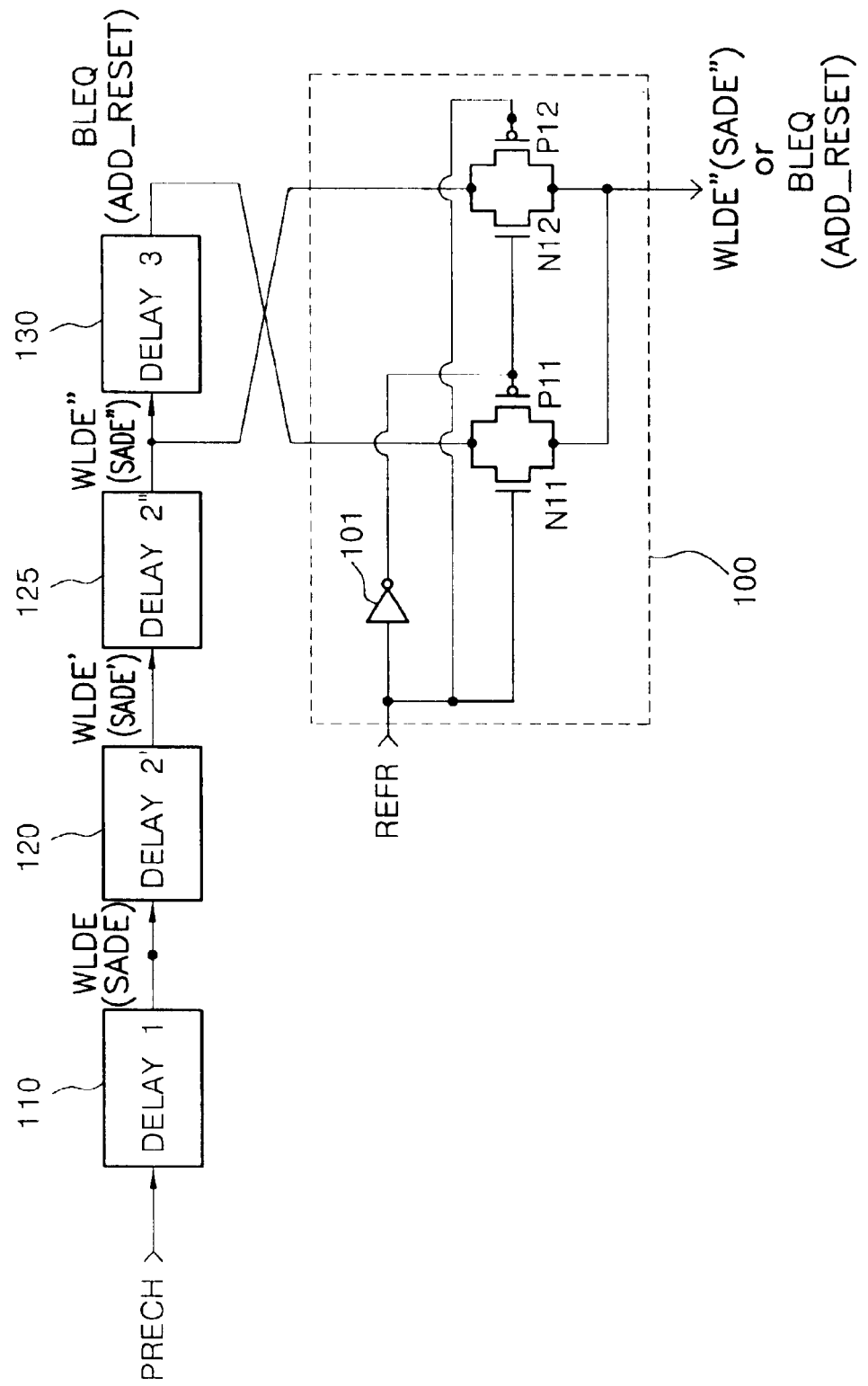
FIG. 6B illustrates a cell data protection circuit in a semiconductor memory device according to another embodiment of the inventions described herein.

As an alternative embodiment, another delay element(s) 125 can be added between the second and third delay parts 120 and 130 in FIG. 6A. The block diagram of the resulting embodiment is shown in FIG. 6B. In FIG. 6B, delay 110 receives the precharge signal PRECH and produces the signal WLDE (SADE), and delay 120 receives the signal WLDE (SADE), delays this signal and produces the signal WLDE' (SADE'). And delay 125 receives the signal WLDE" (SADE") and produces the signal WLDE" (SADE") by delaying the signal WLDE' (SADE' ) by a predetermined time, and delay 130 receives the signal WLDE" (SADE") and produces the signal BLEQ (ADD_RESET). The signal WLDE" (SADE") is input to the passgate of MOS transistors N12 and P12, and the signal BLEQ (ADD_RESET) is input to the passgate of MOS transistors N11 and P11. One of the inputted 2 signals WLDE" (SADE") and BLEQ (ADD_ RESET) is output from the block 100 according to the signal REFR.

In FIG. 6B, the generation time of the bit line equalizing signal BLEQ is controlled after the word line disabling signal WLDE is produced on the refresh operation. Such a case may be used for producing the bit line equalizing signal BLEQ delayed for a while after the word line is disabled on the refresh operation. Namely, such an embodiment is very useful for a semiconductor memory device having a locking time in a delay-locked loop (DLL)

Accordingly, a data protection circuit in a semiconductor memory device according to the present invention, as is the same of the related art, enables to satisfy both 'tRP' and 'tRWL' by producing the bit line equalizing signal BLEQ right after the word line disabling signal WLDE is generated on a normal operation.

Moreover, the present invention, which needs no margin such as 'tRWL' on a refresh operation, enables to protect data carried by the bit line by producing the word line disabling signal WLDE in a short time and then by producing the bit line equalizing signal BLEQ after a predetermined time elapses.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of driving a refresh mode in a semiconductor memory device, comprising:
    disabling a word line in the refresh mode faster than in a normal mode; and
    initiating a bit line equalizing in the refresh mode in a same way of the normal mode,
    wherein the bit line equalizing is initiated after the word line is disabled by a word line disabling signal so as to prevent an influence of the bit line equalizing on cell data.

2. The method of claim 1, wherein the word line is disabled after being active for 6 to 7 ns.

3. The method of claim 1, wherein the bit line equalizing is initiated at a time point satisfying a RAS precharge time condition.

4. A method of driving a refresh mode in a semiconductor memory device, comprising:
    disabling a word line in a refresh mode in a same way of a normal mode; and
    initiating a bit line equalizing in the refresh mode slower than in the normal mode,
    wherein the bit line equalizing is initiated after the word line is disabled by a word line disabling signal so as to prevent an influence of the bit line equalizing on cell data.

5. A cell data protection circuit in a semiconductor memory device, comprising:
    a first delay element producing a word line disabling signal having a first delay time and a bit line sense amplifier disabling signal having the first delay time by receiving a precharge signal;
    a second delay element producing the word line disabling signal and bit line sense amplifier disabling signal having a second delay time by receiving the word line disabling signal and the bit line sense amplifier disabling signal from the first delay element;
    a third delay element producing an address reset signal having a third delay time and a bit line equalizing signal having the third delay time by receiving the word line disabling signal and the bit line sense amplifier disabling signal outputted from the second delay element; and
    a selection part outputting the word line disabling signal and the bit line sense amplifier disabling signal generated from the first delay element on a refresh operation, the selection part outputting the word line disabling signal and the bit line sense amplifier disabling signal generated from the second delay element in a normal operation,
    wherein the word line disabling signal and bit line equalizing signal are produced so as to satisfy a RAS precharge time (tRP) and a RAS read time (tRWL) after a write command in the normal operation and wherein the word line disabling signal and bit line equalizing signal are produced so as to leave a time interval between the word line disabling signal and bit line equalizing signal.

6. The cell data protection circuit in a semiconductor memory device of claim 5, wherein a sum of the first to third delay times is less than the RAS precharge time (tRP).

7. The cell data protection circuit in a semiconductor memory device of claim 5, wherein the selection part comprises:
    at least a first transfer gate outputting the word line disabling signal and the bit line sense amplifier disabling signal received from the first delay element on the refresh operation; and
    at least a second transfer gate outputting the word line disabling signal and the bit line sense amplifer disabling signal received from the second delay element on the normal operation.

8. The cell data protection circuit in a semiconductor memory device of claim 7, wherein the first and second transfer gates comprise combinations of PMOS and NMOS transistors respectively.

9. The cell data protection circuit in a semiconductor memory device of claim 5, further comprising a fourth delay element between the second and third delay elements.

* * * * *